United States Patent
Basu et al.

(10) Patent No.: US 8,852,343 B2
(45) Date of Patent: Oct. 7, 2014

(54) APPARATUS FOR CRYSTAL GROWTH

(75) Inventors: Arnab Basu, Belmont (GB); Ben Cantwell, Chester-le-street (GB); Max Robinson, Shincliffe (GB)

(73) Assignee: Kromek Limited, Sedgefield (GB)

( * ) Notice: Subject to any disclaimer, the term of this patent is extended or adjusted under 35 U.S.C. 154(b) by 1269 days.

(21) Appl. No.: 12/598,538

(22) PCT Filed: May 16, 2008

(86) PCT No.: PCT/GB2008/001713
§ 371 (c)(1),
(2), (4) Date: Feb. 5, 2010

(87) PCT Pub. No.: WO2008/142395
PCT Pub. Date: Nov. 27, 2008

(65) Prior Publication Data
US 2010/0139555 A1 Jun. 10, 2010

(30) Foreign Application Priority Data
May 18, 2007 (GB) .................................. 0709632.4

(51) Int. Cl.
C30B 23/06 (2006.01)
C30B 29/48 (2006.01)
C30B 25/10 (2006.01)
C30B 35/00 (2006.01)
C23C 16/42 (2006.01)

(52) U.S. Cl.
CPC ................. C30B 23/06 (2013.01); C30B 29/48 (2013.01); C30B 25/10 (2013.01); C30B 35/002 (2013.01); C23C 16/42 (2013.01)
USPC ................. 117/200; 117/89; 117/90; 117/96; 117/104; 117/108; 118/718; 118/719

(58) Field of Classification Search
USPC ........ 117/89, 90, 96, 104, 108, 200; 118/718, 118/719
See application file for complete search history.

(56) References Cited

U.S. PATENT DOCUMENTS

| | | | |
|---|---|---|---|
| 3,619,283 A | 11/1971 | Carpenter et al. | |
| 4,094,268 A | 6/1978 | Schieber et al. | |
| 5,365,876 A * | 11/1994 | Nason et al. | 117/85 |

FOREIGN PATENT DOCUMENTS

| | | |
|---|---|---|
| GB | 944052 A | 12/1963 |
| GB | 2423307 A | 8/2006 |
| WO | WO9910571 A1 | 3/1999 |

OTHER PUBLICATIONS

Aug. 11, 2008 International Search Report for PCT/GB2008/001713 (12 pages).

* cited by examiner

Primary Examiner — Bob M Kunemund
(74) Attorney, Agent, or Firm — Popovich, Wiles & O'Connell, P.A.

(57) ABSTRACT

Apparatus for vapor phase growing of crystals having a single multi-zone heater arranged to heat a heated zone to give a predetermined temperature profile along the length of the heated zone. A generally U-shaped tube having a first limb, a second limb, and a linkage connecting the first and second limbs is located on the heated zone. The first limb contains a source material. The second limb supports a seed such that the source material and seed are spaced longitudinally within the heated zone to provide a predetermined temperature differential between the source and seed. The crystal is grown on the seed.

33 Claims, 3 Drawing Sheets

APPARATUS FOR CRYSTAL GROWTH

FIELD OF THE INVENTION

The present invention relates to an apparatus for vapour phase crystal growth.

BACKGROUND TO THE PRESENT INVENTION

To grow a crystal by vapour phase crystal growth techniques, it is necessary to provide a source of the materials from which the crystal is to be formed, and a seed onto which the crystal is grown from the source material. A transport zone links the source and sink zones. By creating a temperature difference between the source zone and the sink zone where the seed is provided, a vapour pressure difference will be created between the source and sink zones which acts as the driving force for crystal growth. The temperature of the source zone should be greater than the temperature of the sink zone.

The control of the crystal growth will be dependent on a number of factors, including the source and sink temperatures and the vapour pressures.

In early vapour phase crystal growth systems, the crystal was grown on a seed crystal provided in a sealed, tubular, quartz ampoule from source material also provided in the ampoule. The ampoule was provided in a tubular furnace to heat the source and sink zones. However, it is very difficult to control the growth of crystals using such a system.

The provision of a first flow controller between the source and seed zones, in combination with a second flow controller downstream of the seed zone to provide continuous pumping to remove a proportion of the source material from the seed zone was suggested to improve the basic tubular system. The provision of the first flow controller acts to make the mass transport rate less sensitive to the temperature differential between the source and sink zones than in the basic tubular system, although the temperature difference is still an important factor.

An alternative apparatus is disclosed in WO 99/10571 in which independent heating means are provided for each of the source and sink zones. The source and sink zones, together with the independent heating means, are provided in a vacuum chamber. This enables more accurate control of the source and sink temperatures, and therefore of the temperature difference between these zones, to enable a solid-vapour-solid phase transition in the source, transport and sink zones. However, the heating means must be one able to operate in a vacuum. Therefore, heaters such as resistance coil heaters are unsuitable. A flow restrictor can be provided in the transport zone between the source and sink zones to provide additional control.

SUMMARY OF THE INVENTION

According to one aspect of the present invention, rather than providing independent heaters for heating the source and sink zones, a single multi-zone heater is provided which provides a heated zone having a predetermined temperature profile along its length. The apparatus includes a generally U-shaped tube having a first limb, a second limb, and a linkage connecting the first and second limbs. A source material is provided in a source zone provided in the first limb of a generally U-shaped tube. A seed is provided in a sink zone in the second limb of the generally U-shaped tube. The longitudinal distance of the source zone from the linkage and the longitudinal distance of the sink zone from the linkage of the generally U-shaped tube is selected such that, when the U-shaped member is provided in the heated zone created by the multi-zone furnace, the source and sink zones are located within the temperature profile to provide a required temperature differential between the source and sink zones.

The temperature differential between the source and sink zones will be dependent on the relative longitudinal positions of the source and sink zones along the respective first and second limbs of the general U-shaped tubular member, and the position of the generally U-shaped tube within the heated zone created by the multi-zone furnace. Therefore, selection of a generally U-shaped member with appropriate relative length first and second limbs, in combination with the longitudinal positioning of the generally U-shaped tube within the furnace, can be used to ensure the desired temperature differential between the source and sink zones. In general, where a temperature differential is required between the source and sink zones, the limbs of the generally U-shaped tube will be different, or at least the location of the source and sink zones will be longitudinally spaced within the heated zone.

Compared to linear tubular systems, the present invention has the advantage that the provision of a linkage between the source and sink zones in separate limbs of a generally U-shaped tube assist in providing thermal isolation between the source and sink zones. This thermal isolation assists in ensuring and controlling the temperature differential between the source and seed zones, and therefore assists with the control of crystal growth.

Compared to systems such as that disclosed in WO 99/10571, the present invention provides a more simple system since there is no requirement either for independent heating means for independently heating the source and sink zones, and no requirement for the entire apparatus, including the heating elements, to be provided in a vacuum. This is a particular advantage as the provision of the heating elements within a vacuum greatly increases the time required to raise the temperature of the source and sink zones, and also limits the types of heater that can be used. It is, however, preferred that at least the source and sink zones and the linkage of the generally U-shaped tube are provided within a vacuum jacket to isolate the portions of the system in which the crystal is grown.

According to a second aspect of the present invention, there is provided a method of forming a bulk crystal material on a seed crystal using an apparatus according to the first aspect of the present invention. In this case, the method includes the steps of providing a source material in a first limb of the generally U-shaped tube, providing a seed crystal in the second limb of the generally U-shaped tube, and providing the generally U-shaped tube within the heated zone to provide a temperature gradient between the source material and the seed crystal to cause the deposition of bulk crystal material on the seed crystal. It will be appreciated that by selection of a generally U-shaped tube with limbs of desired length, or by adjustment of the position of the generally U-shaped tube within the heated zone, the temperature gradient between the source and sink can be controlled, and thereby the growth of the crystal material on the seed crystal can be controlled.

Further optional features of the first and second aspects of the invention are set out below.

A flow restrictor may be provided in the transport zone between the source and sink zones, for example in the linkage. The flow restrictor is able to reduce the sensitivity of the mass transport rate to the temperature differential between the source and sink zones. Suitable flow restrictors include a capillary or a sintered quartz disk.

Advantageously, the sink zone is connected to a vacuum pump or similar means to draw excess source material and volatile impurities from the sink zone.

The seed crystal in the sink zone is preferably located within the second limb of the generally U-shaped tube with an annulus around the outside of the seed crystal separating this from the side wall of the U-shaped tube. Since the growth of the crystal material is a focussed growth, the material is deposited only on the seed crystal. Material is not sputtered or sprayed onto the surrounding limb as would be the case for deposition techniques such as sputtering techniques. This enables excess source material to be removed from the sink zone, and also prevents the formation of the crystal on the side wall of the tube.

The seed crystal is preferably provided on a support that is able to be moved longitudinally along the limb of the U-shaped tube. This may be achieved by providing the support on an elongate member that extends through the second limb and which can be moved longitudinally within the limb. By adjusting the position of the seed crystal within the limb, adjustment of the temperature differential between the source and seed crystal can be achieved. This is of particular advantage where a thick crystal is being formed. Crystal material will be deposited initially on the top surface of the seed crystal. As material is deposited, further material will be deposited onto the already deposited material. As more material is deposited, the relative height of the top of the crystal material where new material is deposited compared to the source will decrease due to the increasing thickness of the deposited material, and therefore the temperature differential between the source material and the top of the crystal material where the new material is grown will decrease. This will affect the growth of the crystal material. By adjusting the position of the seed crystal during growth, the top of the crystal on which the fresh material is deposited can be maintained at the same relative position, and therefore at the same temperature differential, with respect to the source.

It is preferred that the seed crystal is rotatable around the axis of the limb in which it is provided. By rotating the seed crystal during deposition of the crystal material, a more even crystal growth can be achieved. Rotation of the seed crystal may be achieved by rotation of an elongate member extending through the limb of the tube. The elongate member may be driven by a motor.

The multi-zone furnace can be a three-zone furnace.

Preferably, the same multi-zone furnace with the same resulting temperature profile is used for all crystal growth, the control of the relative temperature between the source and sink zones being achieved by the geometry and positioning of the generally U-shaped tube within the heated zone created by the furnace, and by the positioning of the source and sink zones within the limbs of the tube. This means that the apparatus can be produced more cheaply than systems requiring computer or other control of the heater or heaters to provide a predetermined temperature profile. Also, this enables the heater to be heated to the single temperature profile, and then selected generally U-shaped tubes including the required source material and seed crystals at the required relative position to be introduced into the already heated zone, rather than requiring heating of the various zones in position. An additional or alternative control of the crystal growth is the selection of flow restrictor.

It will be appreciated that multiple source or sink zones could be provided by selection of appropriate tubes. For example, where two separate sources are required for formation of a single crystal on a single seed, the tube will comprise a first limb including the first source material connected to the second limb including the seed via a first linkage, and a further limb including the second source material connected to the second limb via a second linkage. In this case, the relative length of the first and third limbs can be selected such that the first and second sources are positioned within the temperature profile of the heated zone formed by the heater with respect to each other and to the seed to provide the required temperature differential. In this case, the first and second sources may be provided at the same or at a different longitudinal position within the heated zone as required. It will be appreciated that further limbs may be provided including further source zones with further source materials as required.

Where multiple linkages are provided associated with additional limbs, any or all of these may be provided with independent flow restrictors.

Where multiple sources are provided, the composition of the crystal material deposited may be changed during the growth. This control may be achieved by control of the flow restrictors, or by the temperature gradient between the source and sink zones. In one example, the crystal material is initially deposited at a low deposition rate, with the deposition being controlled to increase the rate of deposition.

Alternatively or additionally, further sink zones may be provided in further limbs of the tube, each connected to the one or more limbs including the source material by suitable linkages. The inclusion of multiple sink zones permits the simultaneous growth of multiple crystals.

It is preferred that the tube including the or each sink zone and the or each source zone is provided within a chamber within the heated zone. The chamber is preferably evacuated. This helps ensure that there is no contamination of the source materials of the grown crystal. In this case, the heater is preferably provided outside the chamber.

The system of the present invention may be used to grow bulk crystal materials or thin films, for example films with a thickness of around 20 nm.

Many different bulk crystal materials may be deposited using the apparatus of the present invention. These include group II-VI materials such as cadmium telluride (CdTe), cadmium zinc telluride (CZT) and cadmium manganese telluride (CdMnTe).

The seed crystal may be a crystal of the same or similar material as deposited on the seed crystal. In this case, the deposited crystal material will have similar thermal and crystal structures to the seed crystal, and therefore will be able to grow with minimal discontinuities.

For some applications, such as detector applications, a bulk crystal material, for example of cadmium telluride or cadmium zinc telluride, may be required having a large area. However, cadmium telluride or cadmium zinc telluride seed crystals of sufficiently large size may not be available, or may only be available at high cost. In such a case, it would be desirable to form the crystal material on a seed crystal of a different material, for example on a silicon or gallium arsenide seed crystal, that it more easily or cheaply available.

This can be achieved by the use of a seed crystal comprises a crystal of a material different from the material to be deposited, the seed crystal being provided with an intermediate layer or region onto which a bulk crystal material is deposited using the apparatus of the present invention. Depositing a bulk crystal material on a dissimilar seed crystal may be also beneficial for functional reasons.

In one example, the seed crystal includes an intermediate layer provide and formed directly onto the seed crystal, and a transition region providing a transition from the material of the intermediate layer to the bulk crystal material being formed on the seed crystal. The intermediate layer is generally one having a lattice structure that is compatible with the seed crystal, and could be the same or a different material to the material of the bulk crystal to be deposited by the apparatus of the present invention. The transition region may include a region providing a gradual change from the material of the intermediate layer to the material of the bulk crystal where these are different, or providing a gradual change in lattice structure.

In a preferred example, the transition region and bulk crystal can be deposited using the same growth technique, but with an initial variation in the growth parameters during the growth cycle to gradually change the composition and growth rate of the material deposited on the substrate. During the initial transition, the transition region is formed. After completing the change to the material of the bulk crystal to be deposited, the growth rate can be accelerated to rapidly deposit the bulk crystal material. This can be achieved by moving the generally U-shaped member to a different position in the heated zone, thereby changing the temperature gradient between the source and sink zones.

The intermediate layer may be formed using standard thin film deposition techniques, such as molecular beam epitaxy, chemical vapour deposition, sputtering, metallo organic chemical vapour deposition (MOCVD), metal organic vapour phase epitaxy and liquid phase epitaxy. Whilst all of these methods are relatively slow, since the intermediate layer is very thin, the growth rate of the layer is not of significant importance in the overall manufacturing process.

Alternatively, one or more discrete intermediate layers may be provided on the seed crystal substrate, with the bulk crystal material being formed onto the upper intermediate layer. In this case, at least one of the intermediate layers should comprise a layer of the same material as the bulk crystal material. The or each intermediate layer may be formed using standard thin film deposition techniques, such as molecular beam epitaxy, chemical vapour deposition, sputtering, metallo organic chemical vapour deposition (MOCVD), metal organic vapour phase epitaxy and liquid phase epitaxy. Whilst all of these methods are relatively slow, since the intermediate layer is very thin, the growth rate of the layer is not of significant importance in the overall manufacturing process.

The provision of one or more intermediate layers between an underlying substrate and an overlying bulk crystal material may provide a device having particularly advantageous properties. For example, the dissimilar substrate and bulk crystal material may provide different functions—for example they may each absorb photons of different energies. The provision of one or more intermediate layers between the dissimilar substrate and bulk crystal material may assist with the transfer of electrons between the two materials, or assist with heat transfer.

In addition to the substrate, intermediate layer, transition region and the bulk crystal material, additional layers may be deposited. For example, a metal layer such as a layer of indium, platinum, gold or aluminum may be formed for electrical contact. Alternatively or additionally a dielectric layer may be provided. This is especially useful where the structure is to be used as a radiation detector as the dielectric layer may act as a filter to block visible and near infra red light.

In one example, one of the dissimilar semiconductor materials may be used for a detector or electronic circuit, and the other semiconductor materials may be used as the heat sink. In this case, the presence of the interfacial region between the two dissimilar materials helps ensure effective heat transfer between the two materials. In a further example, one of the dissimilar semiconductor materials may be a material suitable for the detection of photons, for example photons of x-rays or gamma rays. The other semiconductor material may include an electronic circuit, for example in the form of an ASIC, able to process the electrical signals generated by the absorption of photons in the other semiconductor material. In this case, the interfacial region acts to ensure the efficient transfer of the electrical signals from the detector material to the circuit material. This avoids problems associated with forming electrical connections between a detector and a processor, for example resulting from the failure of a wire solder bump connection, and also enabling a greater resolution for more accurate detection. A further possibility with the structure of the present invention is to provide two semiconductor materials that are able to detect photons of different energy, for example where the first bulk single crystal semiconductor material is silicon able to detect low energy photons and the second bulk single crystal semiconductor material is cadmium telluride able to detect high energy photons.

More generally, the seed crystal may include at least part of an electronic circuit, which may be provided in the seed crystal before or after the bulk crystal material is deposited on the seed crystal.

DETAILED DESCRIPTION OF PREFERRED EXAMPLES OF THE PRESENT INVENTION

Figure 1:
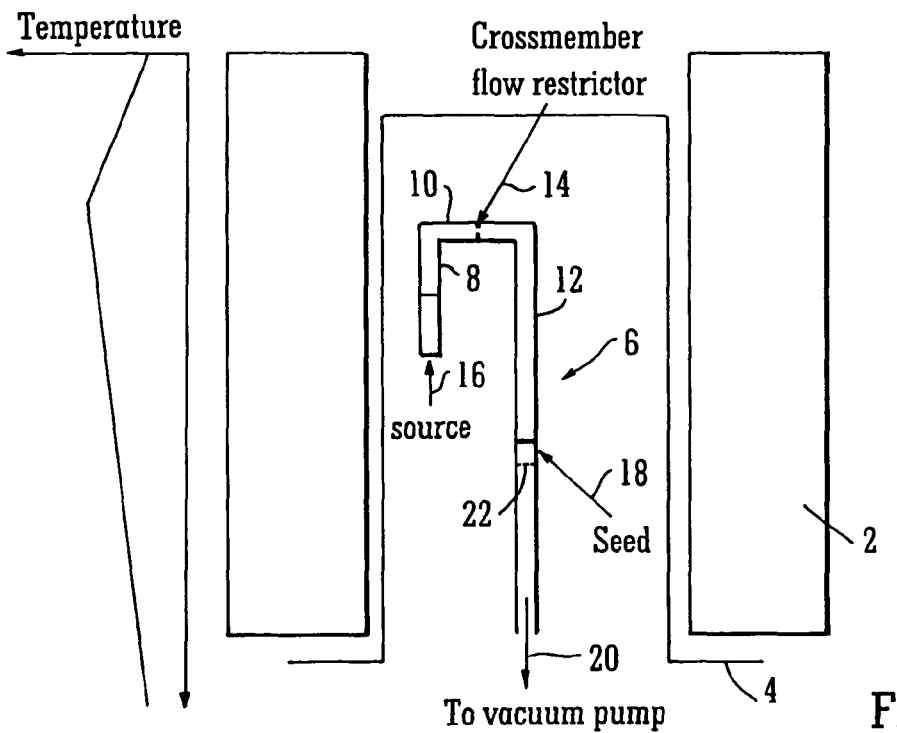
FIG. 1 shows a cross-sectional view of an apparatus according to the present invention including a single source zone and single sink zone.
Figure 2:
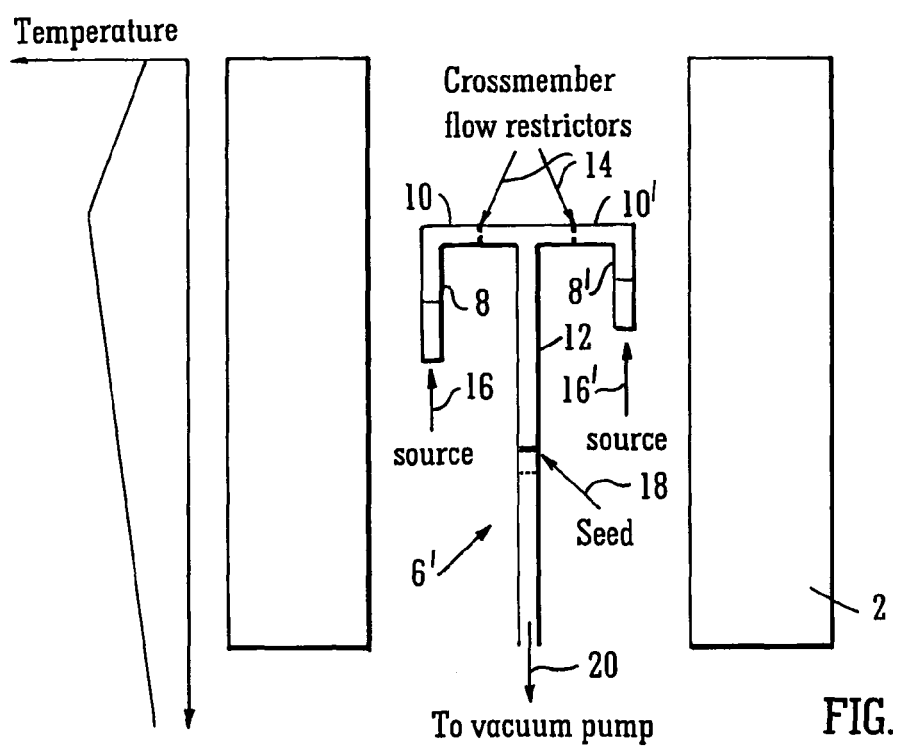
FIG. 2 shows a cross-sectional view of an alternative example of an apparatus according to the present invention including two source zones and single sink zone.

As shown in FIGS. 1 and 2, the apparatus of the present invention includes a multi-zone furnace 2. In the example shown, the furnace is in the form of an annular heater provided to heat a central heated region. It will be appreciated that the heater does not have to be an annular heater, but could for example be a planar heater arranged to heat the heated region from one side, or could comprise a number of heating elements arranged around the heated region. Optical heaters may also be used.

Figure 3:
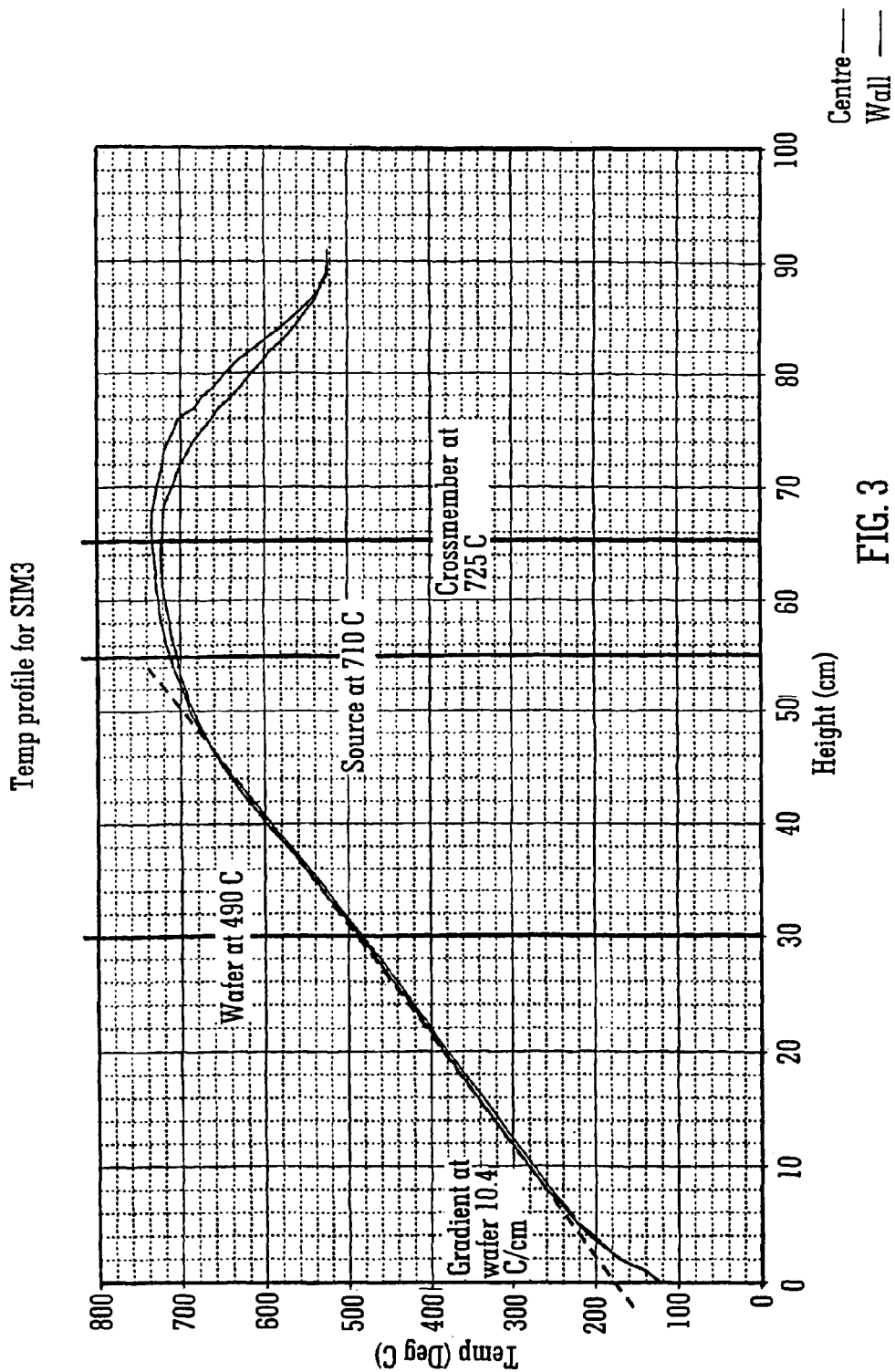
FIG. 3 shows a suitable temperature gradient graph.

As shown in the temperature graph of FIG. 3, the multi-zone heater, which may include three main zones, heats the heated region to provide a predetermined temperature profile. In the example show, the maximum temperature is towards the top of the heater region, with a decreasing temperature above and below this maximum temperature region. The temperature profile is such that the temperature decreases from the maximum temperature at a greater rate above the maximum temperature region than below the maximum temperature region. In the example shown in FIG. 3, the temperature profile is such that the sink can be at a temperature of around 490° C., the source at a temperature of around 710° C. and the linkage at a temperature of around 725° C. However, it will be appreciated that other temperatures may be selected as appropriate.

In the example shown in FIG. 1, a single, generally U-shaped tube 6 is provided having a first limb 8, a second limb 12 and a linkage 10 connecting the first and second limbs 8, 12. Although the generally U-shaped tube 6 is shown with the first and second limbs 8, 12 being parallel to each other and the linkage 10 being perpendicular to each of the first and second limbs 8, 12, it will be appreciated that some divergence from this preferred arrangement is possible, and that the connections between the first limb 8, linkage 10 and second limb 12 need not be sharp, but could be rounded. The angle of divergence should be at least 90°.

The end of the first limb 8 defines the source zone, and is provided with a source material 16. This is generally a solid material that is to be vaporised to be conveyed through the tube 6 to grow the crystal. A seed crystal 18 is provided in the second limb 12 of the tube 6. The seed crystal 18 is mounted on a support 22 provided within the tube 6, and is positioned with an annulus surrounding the seed crystal 18, separating the seed crystal 18 from the inner wall of the tube 6. The annulus defines a second flow restrictor. The support 22 may, for example, be a quartz block with a thickness of between around 1 and 100 mm.

Figure 4:
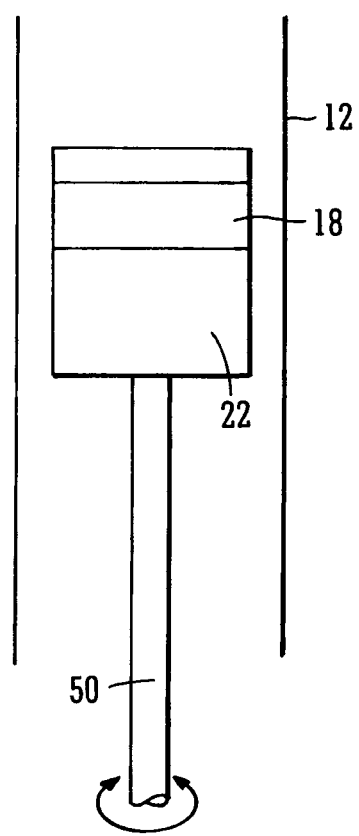
FIG. 4 shows an enlarged sectional view of the seed support.

In a preferred example, as shown in the enlarged sectional view of FIG. 4, the support 22 is provided on an elongate shaft 50 which is driven by a motor to rotate about its longitudinal axis and which is able to move longitudinally to move the support 22 within the limb 12. By rotating the shaft, and therefore by rotating the support 22 and the seed 18 during formation of the crystal, a more even crystal growth can be achieved. By longitudinal movement of the elongate shaft, the position of the upper surface of the crystal on which further crystal material is grown can be adjusted, and therefore the position in the temperature profile can be adjusted. This is of particular advantage when a thick crystal is being formed, as the height of the support 22 can be gradually lowered as the crystal is formed to ensure that the upper surface of the crystal remains at the same position in the temperature profile. Therefore, there remains a constant temperature gradient between the source and sink throughout the formation of the crystal. This would not be the case if the height of the support was not varied in this way, since if the height is not varied, the height of the top of the crystal will increase throughout the deposition process, and therefore the temperature of the top of the crystal where the material is deposited will progressively move through the temperature gradient.

The free end of the second limb 12 of the tube 6 including the seed crystal 18 is connected to a vacuum pump 20 which is arranged to draw off excess vapour from the sink zone around the seed crystal 18. Alternatively or additionally, the free end of the second limb 12 may be connected to a heater for additional heating.

The tube 6 is formed from a material that is able to withstand the temperatures generated by the furnace 2, and which are generally inert such that it does not contaminate the crystal grown. Examples of suitable materials for the tube 6 include quartz, boron nitride, refractory oxides and graphite.

The passageway through the tube may be of constant diameter, or may have a varying cross-section as required. The tube may therefore be cylindrical, conical or have some other cross-sectional shape.

A flow restrictor 14 is provided in the linkage 10. The flow restrictor 14, which may take the form of a capillary transport tube, a disc with a small hole, or sintered quartz disc, acts to control the flow of vapour from the source 16 to the seed crystal 18.

In this example, the tube 6, including the source 16 and seed 18, is encased in a vacuum jacket 4. The vacuum jacked provides a clean environment within which the crystal is grown to help avoid contamination. However, the vacuum jacket is not essential. Alternatively, a vacuum jacket could be provided to cover the entire apparatus, including the furnace. This is not, however, preferred, as this will cause delays in operation of the system which the jacket is evacuated and whilst the temperature of the source and sink zones are raised to the required level. Further, where the heater is provided within the vacuum jacket, there is a risk of contamination of the crystal from the heater, and also the heater must be a specialised heater able to operate within a vacuum.

In the arrangement shown in FIG. 1, the source material 16 may be a source of cadmium telluride and zinc telluride which forms a cadmium telluride crystal on a cadmium telluride seed crystal. However, many other crystals may be grown on suitable seed crystals. Examples of crystals include cadmium zinc telluride (CZT) and cadmium manganese telluride.

Although the source material 16 is described as being a solid, the source material may be supplied as a vapour or as a liquid, for example indium which is liable to evaporate.

It will be appreciated that the temperature of the source zone, linkage 10 and the sink zone where the seed crystal 18 is located will depend upon the position of the tube 6 within the temperature profile of the heated region, and the relative position of the source, sink and linkage 10. By selecting a tube 6 with appropriate relative positions for the source and sink zones with respect to each other and with respect to the linkage 10, for example with suitable length first and second limbs 8,12, or by controlling the position of the support 22 within the second limb 12, the desired relative temperature of the source, sink and linkage 10 can be achieved. Therefore, various tubes 6 with different length first and second limbs 8,12 may be provided and a suitable tube 6 selected for the growth of a particular crystal.

In use, the furnace 2 can be activated to heat the heated zone to produce the required fixed temperature profile, and then the required tube 6 with source material 16 and seed crystal 18 provided within the vacuum jacket 4 can be introduced into the heated zone. Since the zone is already at the required temperature, the relative temperatures of the source and sink zones may quickly be reached, and the crystal grown. Alternatively, the assembly can be provided within the vacuum jacket within the furnace which is then raised to the required temperature. When the crystal is formed, the apparatus may either be cooled down whilst the vacuum jacket including the assembly remains within the furnace, or may be cooled more rapidly by removing this from the furnace.

In the example shown in FIG. 2, the tube 6 of FIG. 1 is replaced with a tube 6' which includes a single limb 12 including the seed crystal 18, but includes two other limbs 8, 8' each connected to the limb 12 by a respective linkage 10, 10'. Each of the other two limbs 8, 8' includes a source material 16, 16', or could be supplied with source material in liquid or vapour form. Each of the linkages 10, 10' include a flow restrictor 14 as described with respect to FIG. 1. In use, the source material 16, 16' from each of the limbs 8, 8' will flow along the respective linkages 10, 10', through the flow restrictors 14 and along the limb 12 to form the crystal on the seed 18.

It will be appreciated that both of the source materials 16, 16' may be the same, or may be different. In many cases, it will be necessary for a different temperature differential between the seed 18 and each of the source materials 16, 16'. As shown in FIG. 2, this can be achieved by forming the limbs 8, 8' with different lengths, so that they will be at different locations, and therefore at different temperatures within the heated zone.

In the example shown in FIG. 2, there is no vacuum jacket provided around the tube 6. In all embodiments of the invention, a vacuum jacket may be provided or omitted.

Although FIG. 2 shows only two limbs 8, 8' including source material 16, 16', additional limbs may be provided including source material, in each case linked by a linkage which can optionally include a flow restrictor to the limb 12 including the seed crystal 18. In this case, the length of each of the limbs can be selected to position the source material at the correct location within the heated zone, and therefore at the desired temperature.

Furthermore, although both examples show only a single limb 12 including a seed crystal 18 on which the crystal material is grown, it will be appreciated that a plurality of limbs may be provided, each with a seed crystal, for the simultaneous growth of a plurality of crystals. In this case, each of the limbs including source material is connected by a linkage to each of the limbs including seed crystals.

The growth of the crystal may be viewed from the top of the apparatus, viewing through the linkage and down the limb in which the crystal is grown. This optical pathway to the seed may also permit optical heating, as well as measurement and imaging of the temperature, growth rate and crystal surface.

In one example, the seed crystal 22 is formed from a different material to the bulk crystal material to be formed on the seed crystal 22. For example, the seed crystal may be a silicon or gallium arsenide crystal, and the bulk crystal material deposited on the seed crystal may be cadmium telluride, cadmium zinc telluride or cadmium manganese telluride.

In this case, the seed crystal 22 is provided with one or more intermediate layers on its upper surface. The or each intermediate layer may be formed as thin films using known thin film deposition techniques such as molecular beam epitaxy, chemical vapour deposition, sputtering, metallo organic chemical vapour deposition (MOCVD), metal organic vapour phase epitaxy and liquid phase epitaxy. The seed crystal including the intermediate layers may then be provided in the second limb of the generally U-shaped tube, and the bulk single crystal material deposited on this as described above. In this case, the intermediate layer or layers act to avoid a lattice mismatch between the underlying seed crystal and the bulk crystal material that is deposited.

Alternatively, the intermediate layer or layers may be deposited onto the seed crystal using the apparatus of the present invention. In this case, the seed crystal is provided in the second limb of the generally U-shaped tubular member, and the source material for forming the intermediate layer is provided in the first limb. The generally U-shaped tubular member is positioned within the heated zone to provide a temperature differential suitable to grow a thin film at a growth rate of between 1 and 10 microns/hour. This is much less than the growth rate for subsequent growth of the bulk crystal material. The apparatus is maintained in position until the required thin film has been grown, and then the conditions are changed to deposit the bulk crystal material. The change in conditions may be achieved by changing the position of the generally U-shaped tube within the heated zone, thereby changing the temperature gradient between the source and sink zones, and thereby changing the growth rate, and/or by changing the source materials that are used to deposit the bulk crystal onto the seed substrate. The change in conditions may be a gradual change, which results in the formation of a transition region between the intermediate layer and the bulk crystal layer, or a rapid change in conditions which creates a rapid transition between the intermediate layer or layers and the bulk crystal material. In one example, the seed crystal is a gallium arsenide crystal, and the bulk crystal material is cadmium telluride. In this example, cadmium telluride is grown as an intermediate layer or transition region. This region is grown slowly, for example with a low temperature difference between the source and seed. The region may be highly stressed. The temperature differential is then increased, resulting in a higher growth rate, to deposit the bulk crystal material.

There are a number of factors which determine whether a particular material can suitably be deposited on an existing layer, or whether problems will arise from the mismatch between the adjacent layers or regions. A mismatch may occur where there is a mismatch between parameters such as the lattice parameters, the thermal expansion coefficient and/or the coefficients of elasticity. Ideally, the parameters for the material of adjacent layers or regions should be as close as possible to minimise mismatches. A layer may be of substantially the same material as an adjacent layer or bulk semiconductor material with doping and/or incidental impurities. Where there is a large difference in the lattice parameters for adjacent layers or regions, for example where the difference between lattice parameters is greater than 3%, misfit dislocations will occur as the subsequent layer is deposited. However, these misfit dislocations will in most cases grow out over the first few atomic layers—typically within 10 microns—so that the remainder of the material will be fully relaxed. However, this relaxation occurs only at the temperature of growth. Where there is a difference between the thermal expansion coefficients of the adjacent layers, at temperatures other than the temperature of growth, there will be thermal strain. Such strain can be transmitted to other layers or regions in the structure, for example to the substrate or crystal material. Where the crystal material is sufficiently thick, the strain will generally be located in the substrate. For example, it has been found that when a CdTe layer, with a thickness of about 250 microns, is formed on a 350 micron gallium arsenide substrate at 500° C., there will be substantially no strain in the CdTe layer when the device is held at a temperature of around 700° C. during subsequent crystal formation.

Where the material is to be used for detection of radiation, the required thickness of the material will be dependent upon the energy to be absorbed. For cadmium telluride, cadmium zinc telluride and cadmium manganese telluride, the thickness of material required for absorption of radiation of various energies is as set out below:

| Photon Energy | Thickness required for 50% absorption |
| --- | --- |
| 30 keV | 0.007 cm |
| 100 keV | 0.07 cm |
| 200 keV | 0.35 cm |
| 500 keV | 1.2 cm |
| 750 keV | 1.7 cm |
| 1-10 MeV | 2.3-3.5 cm |

The invention claimed is:

1. An apparatus for the vapour phase growing of crystals, the apparatus comprising:
   a single multi-zone heater arranged to heat a heated zone to give a predetermined temperature profile along the length of the heated zone;
   a generally U-shaped tube arranged to be provided within the heated zone, the generally U-shaped tube having a first limb, a second limb, and a linkage connecting the first and second limbs, wherein the first limb has a first length and the second limb has a second length different from the first length, and wherein the first limb has a source region arranged to contain a source material; and,
   a support for supporting a seed in the second limb such that the support and the source region are spaced longitudinally within the heated zone to provide a predetermined temperature differential between the source region and support.

2. An apparatus according to claim 1, in which at least one further source limb is provided and coupled to the second limb by an associated linkage, the at least one further source limb including a source region arranged to include a source material.

3. An apparatus according to claim 1, in which at least one further sink limb is provided and coupled to the first limb by an associated linkage, the at least one further sink limb arranged to support a seed.

4. An apparatus according to claim 1, in which the linkage includes a flow restrictor.

5. An apparatus according to claim 1, including a vacuum pump or similar means to draw excess source material from the sink zone.

6. An apparatus according to claim 1, in which the support is arranged to support the seed crystal in the second sink limb of the tube with an annulus around the outside of the seed crystal separating this from the side wall of the tube.

7. An apparatus according to claim 1, in which the support is rotatably mounted in the second limb, such that the support can be rotated during deposition of the crystal material.

8. An apparatus according to claim 1, in which the support can be moved longitudinally within the second limb during deposition of the crystal material.

9. An apparatus according to claim 7, in which the support is mounted on an elongate shaft, such that movement of the shaft causes the rotation of the support.

10. An apparatus according to claim 1, in which the tube is provided within a chamber within the heated zone.

11. An apparatus according to claim 10, in which the chamber is evacuated.

12. A method of vapour phase crystal growth using the apparatus of claim 1, in which the heater is activated to heat the heated zone to a predetermined temperature profile, a source material is provided within the first limb, and a seed crystal is provided within the second limb, and in which the tube including the source material and the seed crystal is provided within the heated zone to cause the growth of the crystal on the seed crystal.

13. A method according to claim 12, in which the crystal is grown as a bulk crystal material or as a thin film.

14. A method according to claim 12, in which the seed crystal comprises a different material to the material of the crystal grown on the seed crystal.

15. A method according to claim 14, in which an intermediate layer is formed on the seed crystal before the crystal material is grown on the seed crystal.

16. A method according to claim 15, in which the intermediate layer is formed using thin film growth techniques before the seed crystal is provided in the sink zone.

17. A method according to claim 15, in which the intermediate layer is formed using the apparatus of claim 1.

18. A method according to claim 15, in which a plurality of intermediate layers are formed on the seed crystal.

19. A method according to claim 15, in which a transition region is formed between the intermediate layer and the crystal material grown on the seed crystal.

20. A method according to claim 19, in which the transition region is formed by gradually changing the position of the generally U-shaped tubular member within the heated zone to vary the temperature gradient between the source zone and the sink zone to gradually increase the rate of deposition of the crystal material to form the transition zone and crystal growth zone.

21. A method according to claim 14, in which the seed crystal includes at least part of an electronic circuit.

22. A method according to claim 21, in which the at least part of an electronic circuit is formed in the seed crystal before the crystal material is grown on the seed crystal.

23. A method according to claim 21, in which the crystal material grown on the seed crystal is a bulk crystal which acts as a radiation detector, and in which the at least part of an electronic circuit provided in the seed crystal includes processing circuitry for processing electrons generated by the bulk crystal material in response to the absorption of photons.

24. An apparatus according to claim 2, in which at least one further sink limb is provided and coupled to the first limb and each further source limb by an associated linkage, the at least one further sink limb arranged to support a seed.

25. An apparatus according to claim 3, in which each linkage includes a flow restrictor.

26. An apparatus according to claim 24, in which each linkage includes a flow restrictor.

27. An apparatus according to claim 3, in which the support is arranged to support the seed crystal in the second and each further sink limb of the tube with an annulus around the outside of the seed crystal separating this from the side wall of the tube.

28. An apparatus according to claim 24, in which the support is arranged to support the seed crystal in the second and each further sink limb of the tube with an annulus around the outside of the seed crystal separating this from the side wall of the tube.

29. An apparatus according to claim 8, in which the support is mounted on an elongate shaft, such that movement of the shaft causes the translation of the support.

30. A method according to claim 12, in which at least one further source limb is provided and coupled to the second limb by an associated linkage, the at least one further source limb including a source region, and in which a source material is provided within any of the further source limbs as required.

31. A method according to claim 12, in which at least one further sink limb is provided and coupled to the first limb by an associated linkage, and in which a seed crystal is provided within any of the further sink limbs as required to cause the growth of a crystal on the seed crystal.

32. A method according to claim 30, in which at least one further sink limb is provided and coupled to the first limb by an associated linkage, and in which a seed crystal is provided within any of the further sink limbs as required to cause the growth of a crystal on the seed crystal.

33. A method according to claim 12, in which the original generally U-shaped tube is replaced with a second generally U-shaped tube arranged to be provided within the heated zone, the second generally U-shaped tube having a first limb, a second limb, and a linkage connecting the first and second limbs, wherein the first limb has a first length and the second limb has a second length different from the first length, and wherein the first limb has a source region arranged to contain a source material, and wherein at least one of the first and second limbs of the original generally U-shaped tube has a different length than the corresponding first or second limb of the second generally U-shaped tube.

* * * * *